(12) United States Patent
Limvorapun

(10) Patent No.: US 9,819,340 B2
(45) Date of Patent: Nov. 14, 2017

(54) P-CHANNEL MOSFET HIGH VOLTAGE DRIVER

(71) Applicant: The Boeing Company, Chicago, IL (US)

(72) Inventor: Suhat Limvorapun, Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 197 days.

(21) Appl. No.: 14/527,882

(22) Filed: Oct. 30, 2014

(65) Prior Publication Data
US 2016/0126944 A1 May 5, 2016

(51) Int. Cl.
H03K 3/00 (2006.01)
H03K 17/687 (2006.01)
H03K 17/082 (2006.01)

(52) U.S. Cl.
CPC ....... *H03K 17/687* (2013.01); *H03K 17/0822* (2013.01); *H03K 2217/0063* (2013.01)

(58) Field of Classification Search
CPC ....... H03K 17/687; H03K 3/012; H03K 3/356
USPC ......................................................... 327/108
See application file for complete search history.

(56) References Cited

U.S. PATENT DOCUMENTS

| | | | | |
|---|---|---|---|---|
| 5,896,043 A * | 4/1999 | Kumagai | ............. | H03K 17/063 326/17 |
| 6,388,499 B1 * | 5/2002 | Tien | ................. | H03K 19/00315 327/112 |
| 7,843,222 B1 * | 11/2010 | Shiah | ............... | H03K 19/00315 326/81 |
| 8,405,442 B2 * | 3/2013 | Chen | ................ | H03K 3/356113 327/333 |
| 8,680,895 B2 * | 3/2014 | Carpenter | ............. | H02M 3/158 318/34 |
| 2003/0173644 A1 * | 9/2003 | Nakase | ............... | H01L 27/0222 257/532 |
| 2004/0160266 A1 | 8/2004 | Coutu | | |
| 2009/0160494 A1 * | 6/2009 | Jan | ................. | H03K 19/018521 327/108 |
| 2011/0037745 A1 * | 2/2011 | Takasugi | .............. | G09G 3/2965 345/211 |
| 2012/0086479 A1 * | 4/2012 | Carpenter | ............. | H02M 3/158 327/109 |
| 2013/0214749 A1 * | 8/2013 | Huang | .................... | G05F 1/595 323/271 |

(Continued)

OTHER PUBLICATIONS

Linear Technology Corporation. "High Speed, High Voltage High Side Gate Driver"; www.linear.com//LTC4440, Linear Technology Corporation, 2003.

*Primary Examiner* — Ryan Jager
(74) *Attorney, Agent, or Firm* — Perman & Green LLP

(57) ABSTRACT

In accordance with one or more aspects of the disclosed embodiments, a drive circuit having a source of modulation for producing a modulated signal, a level shifter configured to receive the modulated signal and produce a level-shifted driver signal, an inverter circuit configured to receive the level-shifted driver signal and produce a MOSFET control signal, and at least one p-channel metal oxide semiconductor field effect transistor (MOSFET) configured to receive the MOSFET control signal and modulate an application of high current to a load, where the MOSFET control signal is supplied directly to the p-channel MOSFET through the inverter circuit.

21 Claims, 9 Drawing Sheets

(56) References Cited

U.S. PATENT DOCUMENTS

| | | | |
|---|---|---|---|
| 2016/0035295 A1* | 2/2016 | Fujikawa | G09G 3/3648 345/100 |
| 2016/0094226 A1* | 3/2016 | Wang | H03K 19/017509 307/130 |
| 2016/0118977 A1* | 4/2016 | Yi | H03K 17/145 323/271 |

* cited by examiner

P-CHANNEL MOSFET HIGH VOLTAGE DRIVER

FIELD

The aspects of the exemplary embodiments generally relate to a high voltage driver and, more particularly, to a high voltage driver with a P-channel MOSFET.

BACKGROUND

The use of P-channel metal oxide semiconductor field effect transistors (P-channel MOSFETs) for high side drivers has been limited to low voltage applications traditionally, typically for voltages under 20 volts. This is due to the breakdown of the P-channel MOSFET gate at high voltages, which typically limits the use of P-channel MOSFETs to situations where the $V_{gs}$ is +/−20 volts. Other approaches for driving high voltage P-channel MOSFETs often suffer other undesirable limitations such as limited switching speed and low or underutilized duty cycles. Often, the most common approach to high side and high voltage MOSFET switching is employing an N-channel MOSFET with commercially available drivers for level shifting. However, this approach is not without drawbacks. N-channel MOSFETs require a separate floating power supply for each MOSFET. Not only does this add to complexity in manufacturing and operating, but it also increases costs as more parts are required to operate N-channel MOSFET high side drivers. Using commercially available IC (integrated circuit) drivers also has disadvantages. Commercially available ICs often have duty cycle limitations of less than 100%. There are also other IC chips with charge pumps for level shifting, but the gate drive current is often limited to accommodate smaller size power MOSFETs. Further, these charge pump N-channel driver IC chips are often limited to a maximum of 80 volts.

Because of the limitations of the prior art, it is desirable to have a system for high voltage level switching using P-channel MOSFET which is capable of high speed switching frequency as well as having fewer floating power sources.

SUMMARY

In accordance with one or more aspects of the disclosed embodiments, a drive circuit having a source of modulation for producing a modulated signal, a level shifter configured to receive the modulated signal and produce a level-shifted driver signal, an inverter circuit configured to receive the level-shifted driver signal and produce a MOSFET control signal, and at least one p-channel metal oxide semiconductor field effect transistor (MOSFET) configured to receive the MOSFET control signal and modulate an application of high current to a load, where the MOSFET control signal is supplied directly to the p-channel MOSFET through the inverter circuit.

In accordance with one or more aspects of the disclosed embodiments, a drive circuit having a source of modulation for producing a modulated signal, at least one switching circuit including a level shifter configured to receive the modulated signal and produce a level-shifted driver signal, an inverter circuit configured to receive the level-shifted driver signal and produce a MOSFET control signal, a p-channel metal oxide semiconductor field effect transistor (MOSFET) being configured to receive the MOSFET control signal and modulate an application of high current to a load, where the MOSFET control signal is supplied directly to the p-channel MOSFET through the inverter circuit, and a floating power supply common to each of the at least one switching circuit and being configured to supply an activation voltage to each p-channel MOSFET of the at least one switching circuit based on the level-shifted drive signal.

In accordance with one or more aspects of the disclosed embodiments, a method of driving at least one p-channel metal oxide semiconductor field effect transistor (MOSFET) including receiving a modulated signal from a modulation source, level shifting the modulated signal with a level shifting circuit to produce a level-shifted driver signal having a voltage greater than a maximum gate voltage of the at least one p-channel MOSFET, inverting the level-shifted driver signal with an inverting circuit to produce an inverted drive output signal, and applying the inverted drive output signal to a voltage driver circuit to provide a scaled drive signal to the gate of the at least one p-channel MOSFET where the at least one p-channel MOSFET is directly coupled to the inverter circuit and provides a modulated high current from a supply to a load.

BRIEF DESCRIPTION OF THE DRAWINGS

Figure 1:
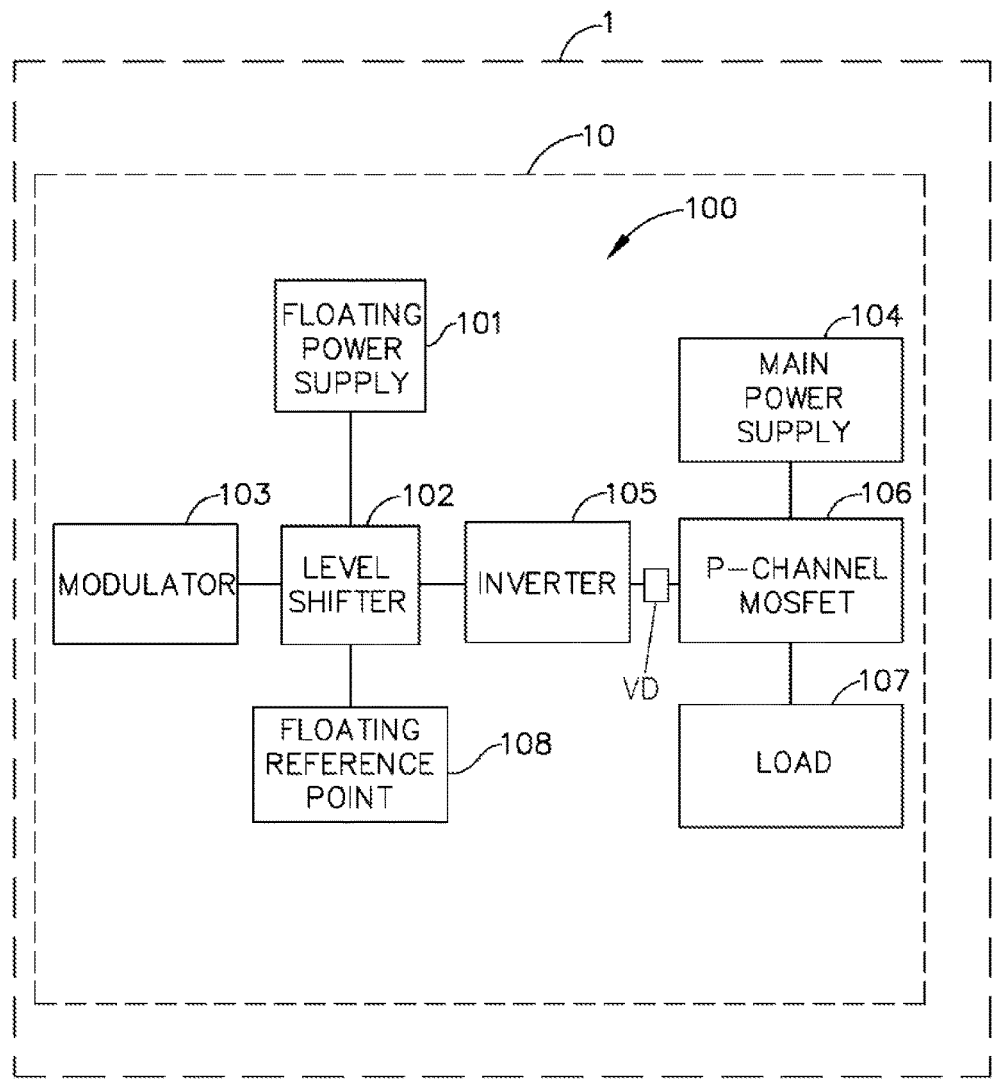
Figure 2:
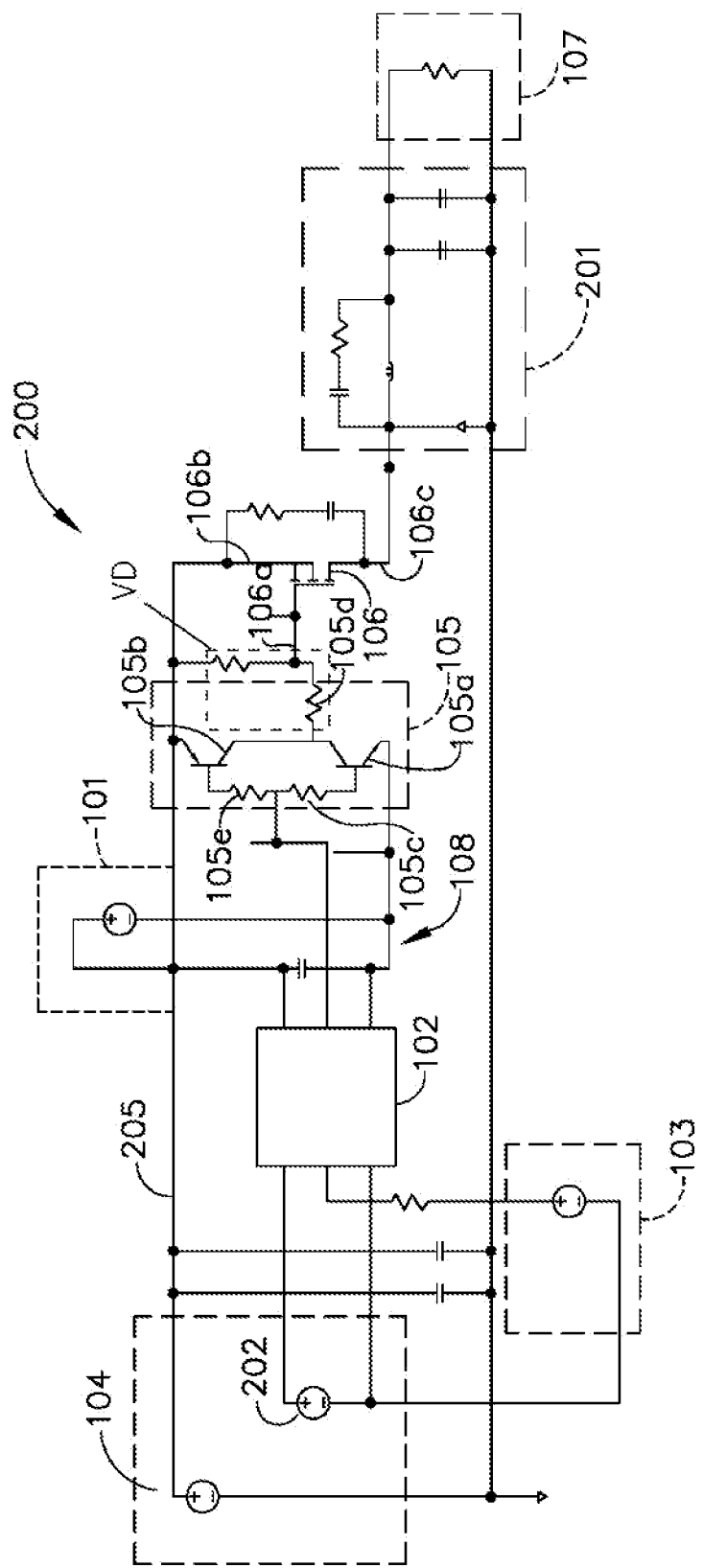
Figure 3:
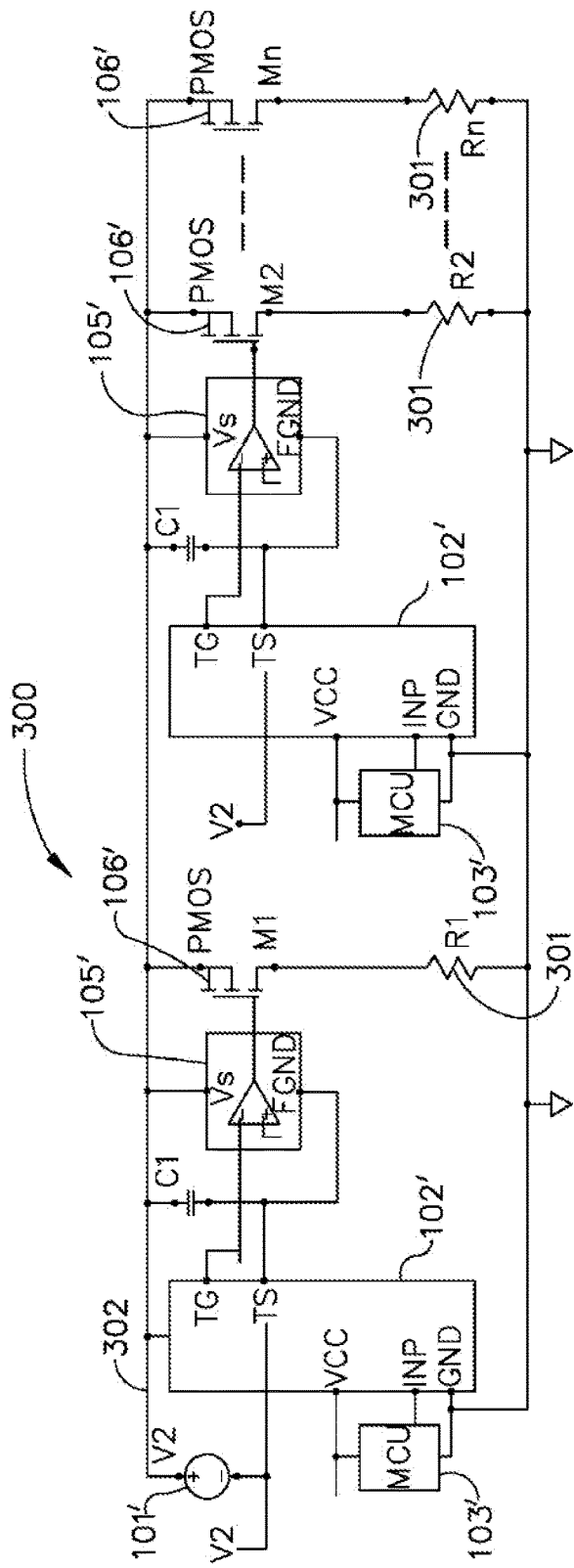
Figure 4:
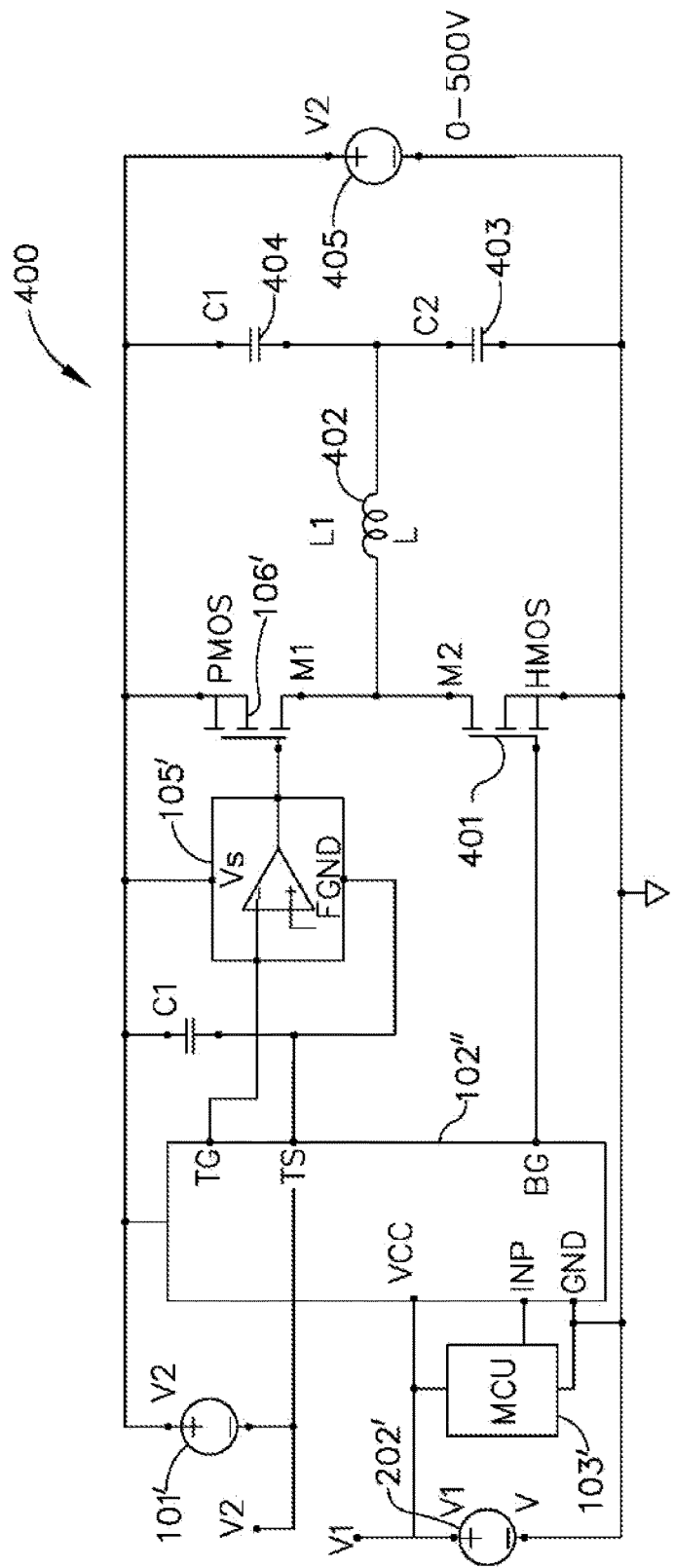
Figure 5:
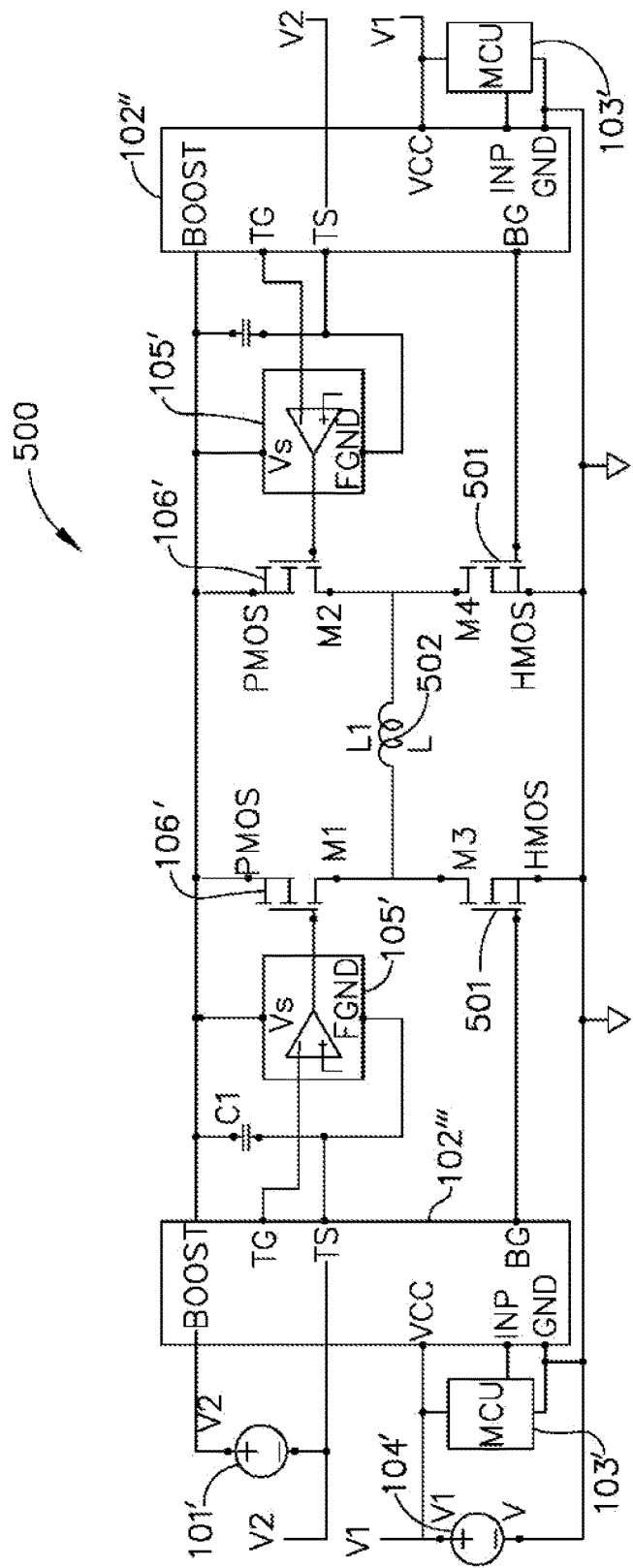
Figure 6:
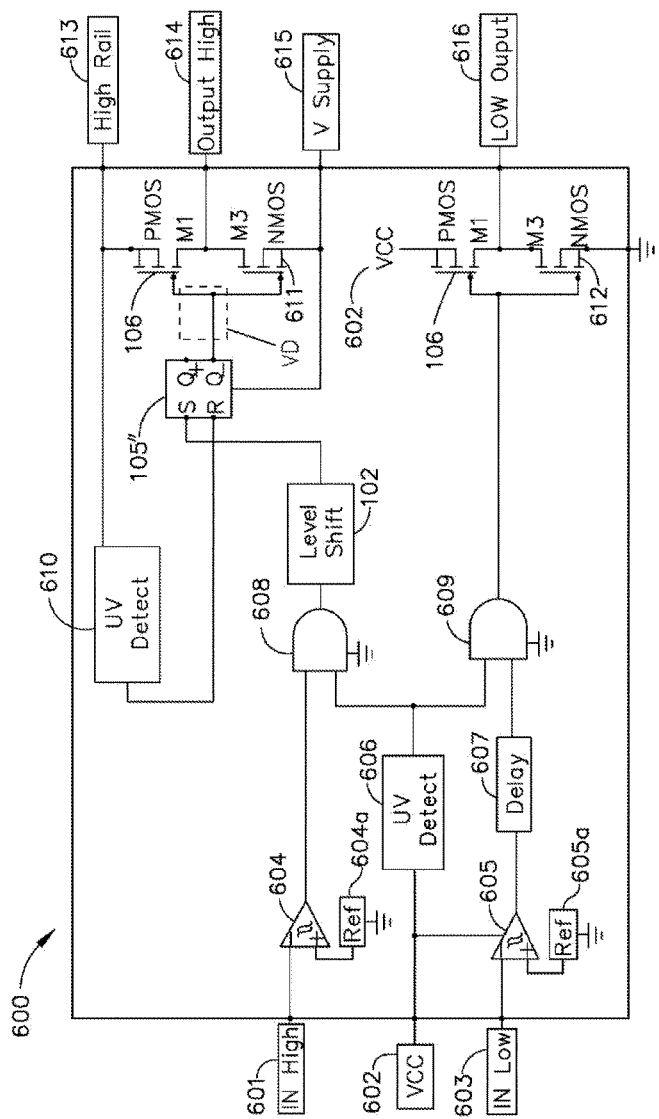
Figure 7:
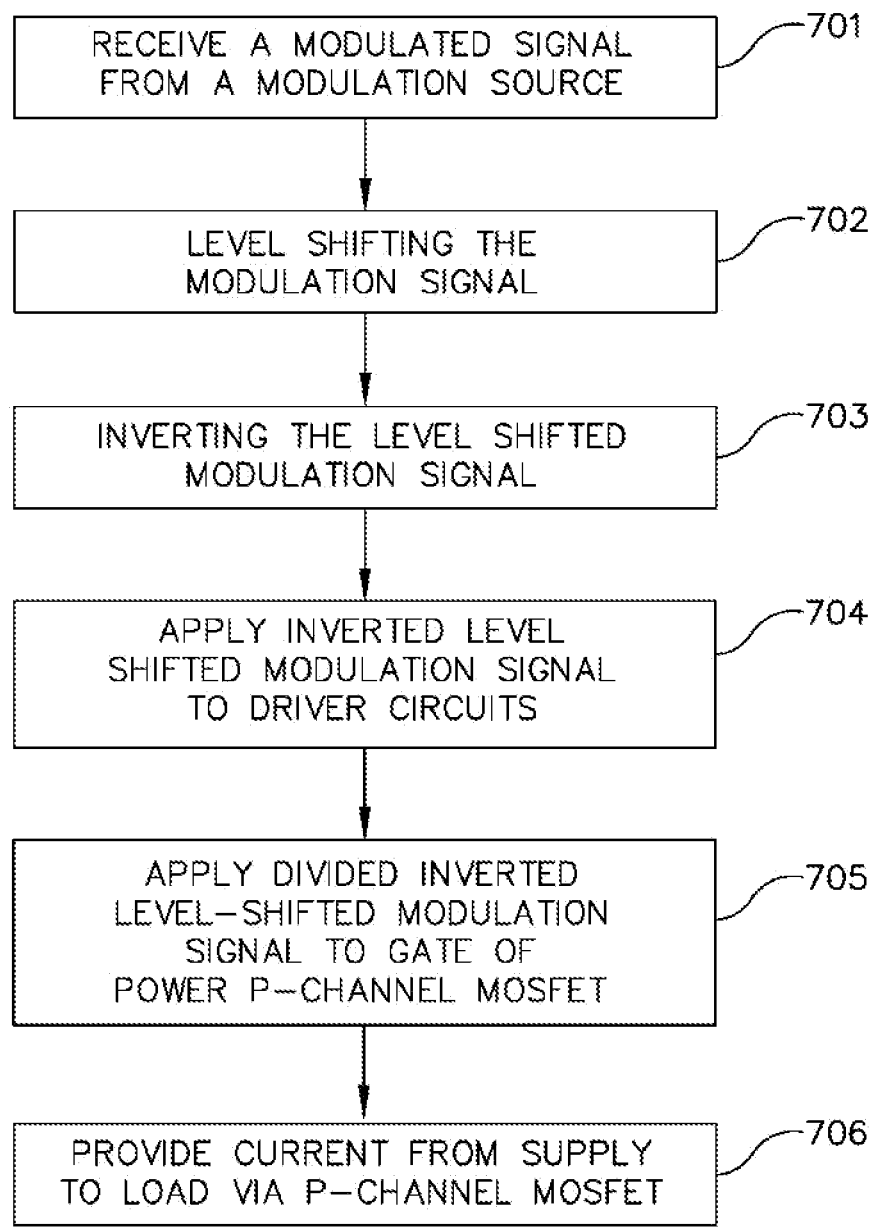
Figure 8:
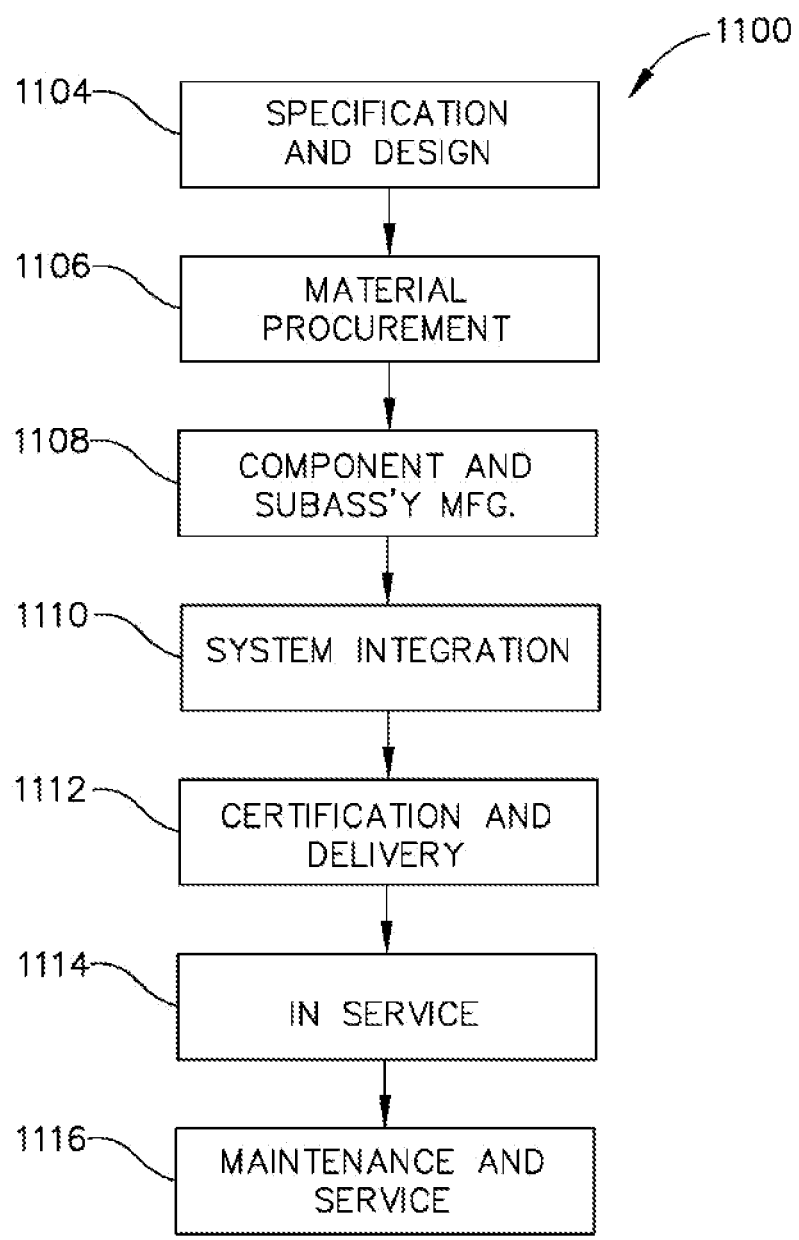
Figure 9:
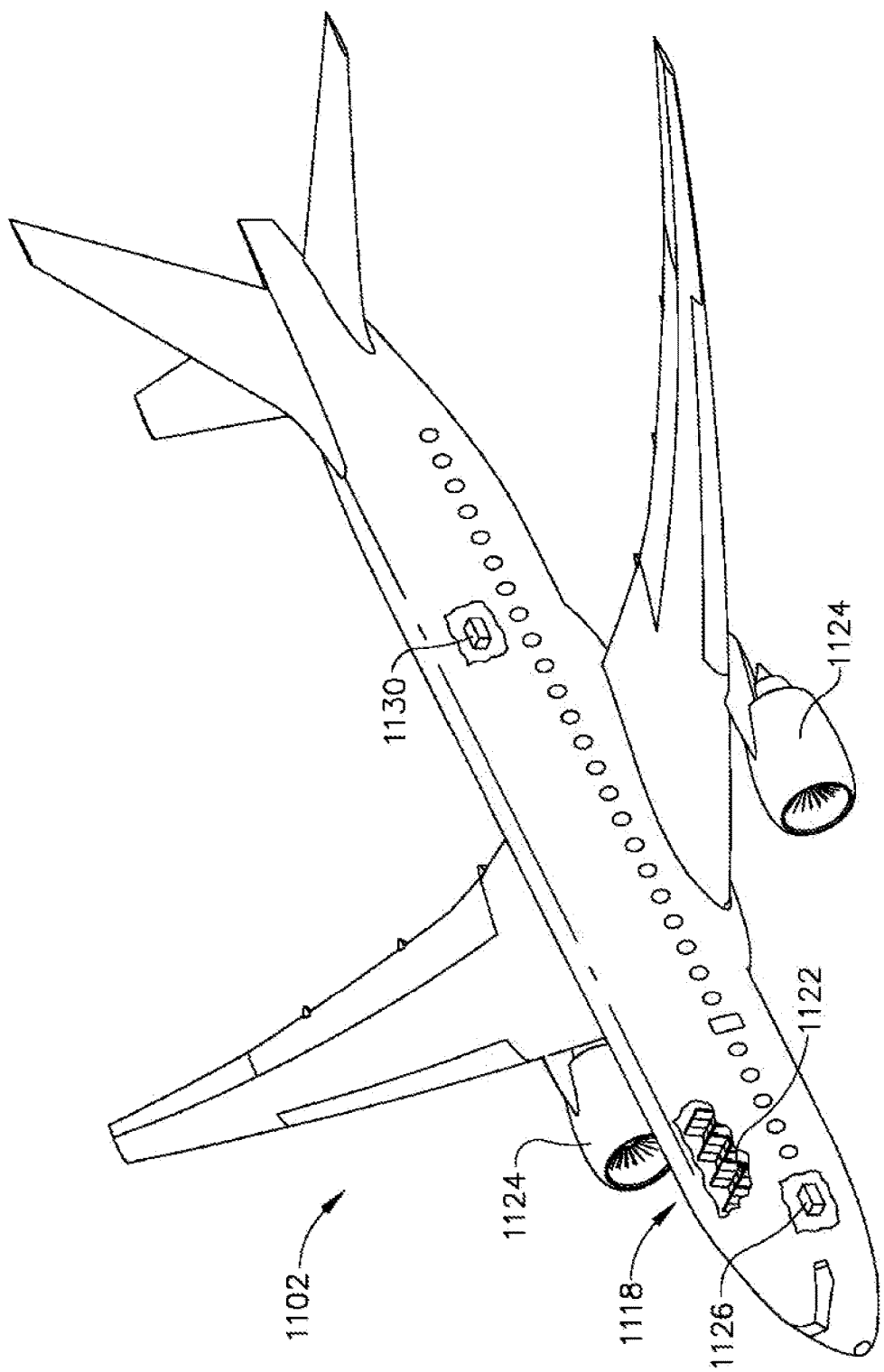

Having thus described examples of the disclosure in general terms, reference will now be made to the accompanying drawings, which are not necessarily drawn to scale, and wherein like reference characters designate the same or similar parts throughout the several views, and wherein:

FIG. 1 is an exemplary block diagram of a P-channel MOSFET high side driver according to aspects of the present disclosure;

FIG. 2 is an exemplary schematic circuit diagram of the P-channel MOSFET high side driver according to aspects of the present disclosure;

FIG. 3 is an exemplary schematic circuit diagram of the P-channel MOSFET high side driver with multiple high side P-channel MOSFETs used as a switch according to aspects of the present disclosure;

FIG. 4 is an exemplary circuit diagram of the P-channel MOSFET high side driver with multiple high side P-channel MOSFETs used in a half bridge power supply according to aspects of the present disclosure;

FIG. 5 is an exemplary circuit diagram of the P-channel MOSFET high side driver with multiple high side P-channel MOSFETs used in a full bridge power supply according to aspects of the present disclosure;

FIG. 6 is an exemplary integrated circuit block diagram of high and low side P-channel MOSFETs according to aspects of the present disclosure;

FIG. 7 is a flow diagram according to aspects of the present disclosure;

FIG. 8 is a flow diagram of aircraft production and service methodology in accordance with aspects of the present disclosure;

FIG. 9 is a schematic illustration of an aircraft in accordance with aspects of the present disclosure.

In the block diagram(s) referred to above, solid lines, if any, connecting various elements and/or components may represent mechanical, electrical, fluid, optical, electromagnetic and other couplings and/or combinations thereof. As used herein, the terms "coupled" or "connected" means associated directly as well as indirectly. For example, a member A may be directly associated with a member B, or may be indirectly associated therewith, e.g., via another member C. Couplings or connections other than those depicted in the block diagrams may also exist. Dashed lines, if any, connecting the various elements and/or components represent couplings or connections similar in function and purpose to those represented by solid lines; however, couplings or connections represented by the dashed lines may either be selectively provided or may relate to alternative or optional aspects of the disclosure. Likewise, elements and/or components, if any, represented with dashed lines, indicate alternative or optional aspects of the disclosure. Environmental elements, if any, are represented with dotted lines.

In the block diagram(s) referred to above, the blocks may also represent operations and/or portions thereof. Lines connecting the various blocks do not imply any particular order or dependency of the operations or portions thereof.

DETAILED DESCRIPTION

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting. It is further noted that all numbers, temperatures, etc. are "about" and provided for exemplary purposes only. All specific numbers, temperatures and any other specific information may be more or less or any suitable number or temperature.

Reference herein to "one example" or "one aspect" means that one or more feature, structure, or characteristic described in connection with the example or aspect is included in at least one implementation. The phrase "one example" or "one aspect" in various places in the specification may or may not be referring to the same example or aspect.

The aspects of the present disclosure allow P-Channel MOSFETs to be employed in high power applications in place of N-channel MOSFETs. In one aspect, all of the switching lanes of the P-Channel MOSFET source pins are tied to the same floating power supply or bus and multiple P-channel MOSFETs are driven by a common floating power supply or bus. Applications such as, for example, a 3Y phase motor driver or an H-bridge power supply (or any other suitable motor driver/power supply) can benefit from aspects of the present disclosure. The elimination of the floating power supply 101 for each lane can significantly reduce parts and weight of, for example, the motor driver or power supply. The aspects of the present disclosure also allow for switching duty cycles for the P-channel MOSFET that range from 0-100%. Capacitive or transformer couplings conventionally employed with MOSFETs have limited duty cycles before the average voltage drops below the MOSFET gate voltage $V_{gs}$ threshold limits. Eliminating the capacitor or transformer coupling allows for constant gate voltage $V_{gs}$ levels at substantially all duty cycles.

Referring now to FIG. 1, an exemplary block diagram of a P-channel MOSFET level-shifting/high side driver 100 according to an aspect of the present disclosure is shown. The P-channel MOSFET level-shifting/high side driver 100 is a part of an electrical system 10 of a vehicle 1. The electrical system 10 is any suitable system or a component of an electrical system such as, for example, a motor driver, power supply or transformer. In one aspect, the vehicle 1 is an aerospace vehicle. However in other aspects, the vehicle 1 is a maritime or automotive/land-based vehicle or any other suitable type of vehicle. The P-channel MOSFET level-shifting/high side driver 100 has a floating power supply 101 which is connected to a level shifter 102 and a floating ground 108. The level shifter 102 is connected to a modulation source 103 and is further connected to an inverter circuit 105. The inverter circuit 105 provides a signal to a P-channel MOSFET which controls a current from a main power supply 104 to the load 107.

Referring again to FIG. 1, the floating power supply 101 may be any suitable voltage source and provides a constant voltage to a floating reference point 108 and provides a voltage to turn the P-channel MOSFET 106 on and off based on a signal from the level shifter 102, which is connected to the floating power supply 101. The level shifter 102 generates a level-shifted driver signal which is a scaled and shifted up modulated output signal received from a modulation source 103. The modulation source 103 is, for instance, in one aspect a pulse width modulator. However, in other aspects, the modulation source 103 is any suitable modulation source such as any suitable microprocessor control units or Schmitt triggers. The modulation source 103 produces a square-wave output as the modulated signal, but in other aspects, the output signal has any suitable configuration. The level shifter 102 takes the modulated signal from the modulation source 103 and produces a level-shifted driver signal that is a scaled and shifted-up modulation source output signal to a high voltage. The level shifted driver signal may have a voltage greater than the maximum gate voltage (Vgs) of the P-channel MOSFET 106. In one aspect, the high voltage may be about 20 volts to about 1000 volts, however in alternate aspects, the voltage may be greater than 1000 volts. The level shifter 102 is, for example, any suitable level shifter. The level shifter 102 is further connected to the inverter circuit 105. The inverter circuit 105 is, in one aspect, an integrated circuit such as a complementary NPN and a PNP transistor or a small complementary P-channel and N-channel MOSFET for driving a gate. The inverter circuit 105 produces a MOSFET control signal based on the level-shifted driver signal received from the level shifter 102. The inverter circuit 105 may further have a voltage divider circuit VD to provide a scaled MOSFET control signal from the inverter circuit 105. The inverter circuit is tied to the voltage of the power supply rail from the floating power supply 101 and may further include a circuit to detect and protect against undervoltage and/or overvoltage between the level shifter 102 and the P-channel MOSFET 106. The P-channel MOSFET 106 is further connected to the main input power 104. The main input power 104 may be any suitable source of current. The main input power 104 is connect to the source terminal of the P-channel MOSFET 106. The P-channel MOSFET 106 is connected to the inverter circuit 105 via the gate terminal and receives the MOSFET control signal and modulates an application of high current from the main input power 104 to a load 107. It is noted that the inverter circuit 105 is directly coupled to the P-channel MOSFET 106, instead of being coupled to the modulation source 103 through a capacitor or transformer, for example, to provide a steady gate voltage. It is noted that capacitive-coupled or transformer-coupled inverter circuits are unable to hold the gate voltage at a steady level. In one aspect, the P-channel MOSFET level-shifting/high side driver 100 has a single P-channel MOSFET 106. However, in other aspects, the P-channel MOSFET level-shifting/high side driver 100 includes a plurality of P-channel MOSFETs which are commonly driven and powered by the floating power supply 101.

Referring now to FIGS. 3-6, several exemplary implementations of the P-channel level-shifting/high side driver are shown. It is noted that, with regard to FIGS. 3-5, the modulation sources 103', level shifters 102', 102" and 102''', inverter circuits 105' and P-channel MOSFETs 106' are substantially similar to the modulation source 103, level shifter 102, inverter circuit 105 and P-channel MOSFET 106 shown in FIGS. 1 and 2. Referring now to FIG. 3, a circuit diagram of a switch with multiple P-channel MOSFET high side drivers is shown. The floating power supply 101' is connected, for example, to the TS terminal of the level shifter 102'. The level shifter 102' receives a modulated output signal from the modulation source 103' through, for example, the VCC and INP terminals. The modulated output signal is level-shifted by the level shifter 102' which is then sent to the inverter circuit 105'. The inverter circuit 105' outputs the MOSFET control signal (e.g. a $V_{gs}$), based on the level-shifted modulated output signal, to the gate terminal of the P-channel MOSFET 106'. The P-channel MOSFET 106' enables a modulated current to pass from the main power rail 302 to a load 301 based on the MOSFET control signal. As can be seen in FIG. 3, there may be multiple modulation sources 103', level shifter 102', inverter circuits 105', P-channel MOSFETs 106', loads 301 connected to the same circuit along the same main power rail 302 and sharing a common floating power supply 101' which form multiple switches.

Referring now to FIG. 4, an exemplary circuit including a P-channel MOSFET used in a half bridge power supply 400 is shown. The half bridge power supply 400 has a floating power supply 101' which is connected to a level shifter 102" via, for example, the TS terminal. The level shifter 102" is substantially similar to the level shifters 102 and 102', but with, for example, an additional BG terminal to control back-gate voltages. The level shifter 102" is further connected to a modulation source 103' which is configured to provide a modulated signal to the level shifter 102" via, for example, the VCC, INP and GND terminals. The modulation source 103' receives voltage from a logic voltage supply 202'. The logic voltage supply is substantially similar to the 12 v logic supply 202 of FIG. 2. The level shifter 102" outputs a level-shifted modulated signal to the inverter circuit 105'. The inverter circuit 105' inverts the level-shifted modulated signal to generate a P-channel MOSFET control signal (e.g. a $V_{gs}$), which is received by the gate terminal of the P-channel MOSFET 106'. The P-channel MOSFET 106 is then connected to an load 402, which is in turn connected to capacitors 404 and 403 and a voltage source 405 (e.g. a high voltage source). The load 402 is also connected to an N-channel MOSFET 401 which receives a signal from the level shifter 102" via the back-gate voltage control terminal BG to control whether the modulated power from the P-channel MOSFET 106' is supplied to the load 402 based on whether a threshold voltage has been exceeded.

Referring now to FIG. 5, an exemplary circuit of P-channel MOSFETs used in a full bridge power supply 500 is shown. The structure of the full bridge power supply 500 is substantially similar to that of the half bridge power supply 400. Starting from the left side of the exemplary circuit diagram, the full bridge power supply 500 has a floating power supply 101' which is connected to a level shifter 102''' via, for example, the TG terminal of the level shifter 102'''. The level shifter 102''' is substantially similar to the level shifters 102, 102' and 102", but with an additional BOOST terminal. The level shifter 102''' is further connected to a modulation source 103' which is configured to provide a modulated signal to the level shifter 102''' via, for example, the VCC, INP and GND terminals. The modulation source 103' receives voltage from a logic voltage supply 202'. The level shifter 102''' outputs a level-shifted modulated signal to the inverter circuit 105'. The inverter circuit 105' inverts the level-shifted modulated signal to generate a P-channel MOSFET control signal (e.g. a $V_{gs}$), which is received by the gate terminal of the P-channel MOSFET 106'. The P-channel MOSFET 106' is then connected to a load 502. The load 502 is also connected to an N-channel MOSFET 401 which receives a signal from the level shifter 104 via, for example, the back-gate voltage control terminal BG of the level shifter 102''' to control whether the modulated power from the P-channel MOSFET 106' is supplied to the load 502 based on whether the threshold voltage has been exceeded. The load 502 is also connected to another P-channel MOSFET 106' which is in turn connected to an inverter circuit 105', level shifter 102''' and modulation source 103' as well as another N-channel MOSFET 501. The second set of P-channel MOSFET 106', inverter circuit 105', level shifter 102''', modulation source 103' and N-channel MOSFET 501 is substantially similar to the first set described above. The level shifters 102" and modulation sources 103' of FIG. 5 may receive voltage from a common floating power supply 101' and a common logic voltage supply 104'.

Referring now to FIG. 2, an exemplary circuit diagram of the P-channel MOSFET high side driver circuit 200 according to an aspect of the present disclosure is shown. As may be realized, the aspects of the present disclosure are implemented on or in any suitable medium. For example, in one aspect, the components illustrated in the figures are mounted to a printed circuit board while in other aspects, at least the inverter is integrated into the MOSFET integrated circuit (IC) for effecting high voltage and high speed P-Channel MOSFET switching and to effect a reduction of parts on the high side of the driver. As may be realized, additional circuit protection can be integrated into the high side driver (whether integrated into an IC having a combined inverter and P-Channel MOSFET or mounted as individual components on a PCB). Examples of additional circuit protection include, but are not limited to, shoot-through protection, undervoltage lockout, current limiting and MOSFET saturation prevention. The circuit 200 is an implementation of a P-Channel high side driver to switch the P-Channel MOSFET on and off with DC-DC converters. With the circuit 200 shown in FIG. 2, the P-channel MOSFET can be switched with an input power supply of up to, for example, 600 V. The P-Channel MOSFET high side driver circuit 200 is an example of how to apply the P-Channel MOSFET switching to a buck regulator 201 capable of switching, for example, at 100 KHz with 0-100% duty cycle at a 100 amp output. The P-channel MOSFET high side driver circuit 200 includes a floating power supply 101 which provides a constant voltage to a floating reference point 108 (also known as a floating ground). The floating power supply 101 also supplies a constant voltage to the level shifter 102, which is connected to the floating power supply 101 at, for example, the BOOST and the TS terminal of the level shifter 102 or, in other aspects, any suitable terminal of the level shifter 102. The level shifter 102, as noted above, is any suitable level shifter. The level shifter 102 receives a voltage from, for example, a 12 volt logic supply 202 and is further connected to the modulation source 103 to receive a modulated output signal as an input via, for example, the INP (input) terminal of the level shifter 102. The modulation source 103 is, as noted previously, in one aspect a pulse width modulator, a microprocessor control unit or a Schmitt trigger. However, in other aspects, the modulation source 103 is any suitable modulation source capable of generating a square wave (or any other suitable) output. The level shifter 102 receives the modulated output signal from the modulation source 103 and generates a level-shifted driver signal. The level-shifted driver signal generated by the level shifter 102 is the modulated output signal that is scaled and shifted-up to a predetermined high voltage. The level-shifted driver signal is sent from the level shifter 102 to an inverter circuit 105. As can be seen in FIG. 2, the inverter circuit 105 is comprised of a PNP transistor 105*b* and a NPN transistor 105*a*, however, in other aspects the inverter circuit 105 has any suitable form including, for example, complementary MOSFET output drivers. The inverter circuit 105 generates a MOSFET control signal which is an inverted level-shifted driver signal (e.g. a Vgs signal) which is connected to the gate terminal 106*a* of a P-channel MOSFET 106. The inverter circuit 105 may include undervoltage and overvoltage detection and protection. For instance, the inverter circuit 105 detects undervoltage or overvoltage so that the P-channel MOSFET 106 would not operate if the MOSFET control signal is above or below a certain voltage. As noted previously, the inverter circuit 105 may further have a voltage divider circuit VD to provide a scaled MOSFET control signal from the inverter circuit 105. The P-channel MOSFET 106 receives the MOSFET control signal from the inverter circuit 105 and applies the signal from the gate terminal 106*a* to the source terminal 106*b*. The source terminal 106*b* is connected to the power rail 205, which receives a current from the main power supply 104. The drain terminal 106*c* then modulates the application of high current from the power rail 205 to a load 107 through the buck regulator 201. It is noted that in the exemplary P-channel MOSFET high side driver circuit shown in FIG. 2, the P-channel MOSFET 106 has one level shifter 102 driving it. However, in alternate aspects, multiple P-channel MOSFETs 106 are driven by a common level shifter 102. Further, each of the multiple P-channel MOSFETs 106 is connected to and driven by the common floating power supply 101. This approach would allow for P-channel MOSFET high side drivers that are less complex and require fewer parts (for example, fewer floating power supplies). This approach will also allow the P-channel MOSFETs 106 to have up to 100% duty cycle at high frequencies up to several hundred kilohertz. High switching frequency of several hundred kilohertz is achievable, for example, because the P-channel MOSFET control signal (e.g., the Vgs) rise times and fall times are driven by the push and pull MOSFET inverter driver such as those inverters described herein. The P-channel MOSFET level-shifting driver described herein will allow for applications of P-channel MOSFET usage in high voltage/power switching applications.

Referring now to FIG. 6, a block diagram of a switch for a high and low side integrated circuit 600 with P-Channel MOSFETs is shown. The block diagram shown in FIG. 6 is an exemplary representation of a P-channel MOSFET integrated circuit driver chip. The high side input source 601 for high side voltage connects to an inverting Schmitt trigger 604 (or other suitable modulation source) which is coupled to a reference ground 604*a*. The Schmitt trigger 604 generates a high side modulated signal from the voltage of the high side input 601. The high side modulated signal is then sent to an AND gate 608. The AND gate 608 also receives a signal from an undervoltage detector 606, which receives voltage from the VCC 602. In alternate aspects, the undervoltage detector 606 may also be configured to detect overvoltage. Low side input 603 is a source for low side voltage which is sent into an inverting Schmitt trigger 605 (or other suitable modulation source). The Schmitt trigger 605 is connected to a reference ground 605*a* and generates a low side modulated signal. The low side modulated signal is then sent through a Delay module 607 to an AND gate 609. The two AND gates 608, 609 allow for the high and low side integrated circuit 600 to select between whether a high side voltage or a low side voltage is outputted. Both AND gates 608, 609 determine whether the voltage from the VCC is undervoltage. If the voltage from the VCC is determined to be undervoltage by the undervoltage detector 606, then the AND gate 609 will trigger and the low side modulated signal from low side input 603 will be sent to the P-channel MOSFET 106 and the N-channel MOSFET 612. The P-channel MOSFET 106 is connected to the VCC 602 via the source terminal of the P-channel MOSFET 106 and is connected to the N-channel MOSFET 612 via the drain terminal. The output of the P-channel MOSFET 106 is a low side output 616. If the voltage from VCC is not undervoltage, then the AND gate 608 will trigger and the high side modulated signal will pass beyond the AND gate 608 to a level shifter 102. The level shifter 102 is substantially the same as the level shifters described above. The level shifter 102 sends a level-shifted high side modulated signal to a flip-flop circuit 105". The flip-flop circuit 105" selects between a signal received from an undervoltage detector 610 connected to the high rail 613 and the level-shifted high side modulated signal received from the level shifter 102. Depending on whether the undervoltage detector 610 detects a voltage or not, the level-shifted high side modulated signal is sent to the P-channel MOSFET 106'. The P-channel MOSFET 106's source terminal is connected to High Rail 613, while the drain terminal is connected to the High Side output 614. The level-shifted high side modulated signal is also sent to an N-channel MOSFET 611, which receives a voltage from the $V_{supply}$ through the source terminal and also connects to the High Side Output 614 via the drain terminal of the N-channel MOSFET 611.

Referring now to FIG. 7, a flow diagram according to aspects of the present disclosure is shown. At block 701, a modulated signal from a modulation source 103 is received. At block 702, the modulated signal received from the modulation source 103 is level-shifted with a level shifter 102 to produce a level-shifted driver signal having a voltage greater than a maximum gate voltage of a P-channel MOSEFET. At block 703, the level-shifted modulated signal is inverted with an inverter circuit 105 to produce an inverted drive output signal. At block 704, the inverted drive output signal is then applied to a voltage driver circuit to provide a P-channel Power MOSFET gate drive signal. At block 705, the scaled drive signal is provided to the gate terminal of a P-channel Power MOSFET 106 where the p-channel MOSFET is directly coupled to the inverter circuit. By applying the voltage divided level-shifted modulated signal to the gate terminal of a P-channel Power MOSFET 106, the P-channel Power MOSFET 106 is able to provide a modulated high current from a current supply to a load.

The disclosure and drawing figures describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or simultaneously.

Examples of the disclosure may be described in the context of an aircraft manufacturing and service method 1100 as shown in FIG. 8 and an aircraft 1102 as shown in FIG. 9. Specifically, the P-channel MOSFET high side driver described herein may be employed, for instance, in any stage of aircraft manufacturing. During pre-production, illustrative method 1100 may include specification and design 1104 of the aircraft 1102 and material procurement 1106. During production, component and subassembly manufacturing 1108 and system integration 1110 of the aircraft 1102 take place. The P-channel MOSFET high side driver described herein may be employed as part of the component and subassembly manufacturing process 1108 as well as part of the specification and design process 1104. Thereafter, the aircraft 1102 may go through certification and delivery 1112 to be placed in service 1114. While in service by a customer, the aircraft 1102 is scheduled for routine maintenance and service 1116 (which may also include modification, reconfiguration, refurbishment, and so on).

Each of the processes of the illustrative method 1100 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIG. 9, the aircraft 1102 produced by the illustrative method 1100 may include an airframe 1118 with a plurality of high-level systems and an interior 1122. Examples of high-level systems include one or more of a propulsion system 1124, an electrical system 1126, a hydraulic system 1128, and an environmental system 1130. Examples of systems which may include electrical systems assembled having the P-channel MOSFET high side driver described herein such as, for example, propulsion system 1124, electrical system 1126, hydraulic system 1128 and environmental system 1130. Although an aerospace example is shown, the principles of the invention may be applied to other industries, such as the automotive and maritime industries.

Apparatus and methods shown or described herein may be employed during any one or more of the stages of the manufacturing and service method 1100. For example, components or subassemblies corresponding to component and subassembly manufacturing 1108 may be fabricated or manufactured in a manner similar to components or subassemblies produced while the aircraft 1102 is in service. Also, one or more aspects of the apparatus, method, or combination thereof may be utilized during the production states 1108 and 1110, for example, by substantially expediting assembly of or reducing the cost of an aircraft 1102. Similarly, one or more aspects of the apparatus or method realizations, or a combination thereof, may be utilized, for example and without limitation, while the aircraft 1102 is in service, e.g., maintenance and service 1116.

In accordance with one or more aspects of the disclosed embodiments, a drive circuit having a source of modulation for producing a modulated signal, a level shifter configured to receive the modulated signal and produce a level-shifted driver signal, an inverter circuit configured to receive the level-shifted driver signal and produce a MOSFET control signal, and at least one p-channel metal oxide semiconductor field effect transistor (MOSFET) configured to receive the MOSFET control signal and modulate an application of high current to a load, where the MOSFET control signal is supplied directly to the p-channel MOSFET through the inverter circuit.

In accordance with one or more aspects of the disclosed embodiments, the drive circuit further having a floating power supply configured to provide a constant voltage from a power supply rail to a floating reference point, and provide a voltage to turn the MOSFET on and off based on the level-shifted driver signal.

In accordance with one or more aspects of the disclosed embodiments, the level-shifted driver signal is a scaled and shifted-up modulated output signal to a predetermined high voltage.

In accordance with one or more aspects of the disclosed embodiments, the predetermined high voltage is about 20 volts to about 1000 volts.

In accordance with one or more aspects of the disclosed embodiments, the drive circuit further having a floating power supply, wherein the at least one p-channel MOSFET comprises a plurality of p-channel MOSFETS and the floating power supply is common to and drives each of the plurality of p-channel MOSFETS.

In accordance with one or more aspects of the disclosed embodiments, the inverter circuit is tied to a voltage of the power supply rail and provides undervoltage and overvoltage protection between the level shifter and p-channel MOSFET.

In accordance with one or more aspects of the disclosed embodiments, the source of modulation is one of a pulse width modulator or a microprocessor control unit.

In accordance with one or more aspects of the disclosed embodiments, the source of modulation produces a square-wave output.

In accordance with one or more aspects of the disclosed embodiments, a drive circuit having a source of modulation for producing a modulated signal, at least one switching circuit including a level shifter configured to receive the modulated signal and produce a level-shifted driver signal, an inverter circuit configured to receive the level-shifted driver signal and produce a MOSFET control signal, a p-channel metal oxide semiconductor field effect transistor (MOSFET) being configured to receive the MOSFET control signal and modulate an application of high current to a load, where the MOSFET control signal is supplied directly to the p-channel MOSFET through the inverter circuit, and a floating power supply common to each of the at least one switching circuit and being configured to supply an activation voltage to each p-channel MOSFET of the at least one switching circuit based on the level-shifted drive signal.

In accordance with one or more aspects of the disclosed embodiments, the floating power supply is configured to provide a constant voltage from a power supply rail to a floating reference point.

In accordance with one or more aspects of the disclosed embodiments, the level-shifted driver signal is a scaled and shifted-up modulated output signal to a predetermined high voltage.

In accordance with one or more aspects of the disclosed embodiment, the predetermined high voltage is about 20 volts to about 1000 volts.

In accordance with one or more aspects of the disclosed embodiments, the inverter circuit is tied to a voltage of the power supply rail and provides undervoltage and overvoltage protection between the level shifter and p-channel MOSFET.

In accordance with one or more aspects of the disclosed embodiments, the source of modulation is one of a pulse width modulator or a microprocessor control unit.

In accordance with one or more aspects of the disclosed embodiments, the source of modulation produces a square-wave output.

In accordance with one or more aspects of the disclosed embodiments, a method of driving at least one p-channel metal oxide semiconductor field effect transistor (MOSFET) includes receiving a modulated signal from a modulation source, level shifting the modulated signal with a level shifting circuit to produce a level-shifted driver signal having a voltage greater than a maximum gate voltage of the at least one p-channel MOSFET, inverting the level-shifted driver signal with an inverting circuit to produce an inverted drive output signal, and applying the inverted drive output signal to a voltage driver circuit to provide a scaled drive signal to the gate of the at least one p-channel MOSFET where the at least one p-channel MOSFET is directly coupled to the inverter circuit and provides a modulated high current from a supply to a load.

In accordance with one or more aspects of the disclosed embodiments, the level-shifted driver signal is a scaled and shifted-up modulated output signal to a predetermined high voltage of about 20 volts to about 1000 volts.

In accordance with one or more aspects of the disclosed embodiments, the method further includes driving the at least one p-channel MOSFET with a floating power supply common to each of the at least one p-channel MOSFET.

In accordance with one or more aspects of the disclosed embodiments, the method further includes providing undervoltage and overvoltage protection between the level shifting circuit and the at least one p-channel MOSFET where the inverter circuit is tied to a voltage of a supply rail.

In accordance with one or more aspects of the disclosed embodiments, the method further includes producing a square wave output with the source of modulation.

What is claimed is:

1. A drive circuit comprising:
at least one source of modulation for producing a high side modulated signal and a low side modulated signal;
a level shifter configured to receive the high side modulated signal and produce a level-shifted driver signal;
at least one p-channel metal oxide semiconductor field effect transistor (MOSFET);
an inverter circuit configured to receive the level-shifted driver signal and produce a MOSFET control signal;
at least one complementary MOSFET having a different predetermined electrical characteristic than the at least one p-channel MOSFET, each complementary MOSFET being coupled with a respective one of the at least one p-channel MOSFET to form a respective p-channel MOSFET and complementary MOSFET group; and
wherein
at least one p-channel MOSFET and complementary MOSFET group is a high side p-channel MOSFET and complementary MOSFET group configured to receive the MOSFET control signal and modulate an application of high current to a load, where the MOSFET control signal is supplied directly to each of the high side p-channel MOSFET and complementary MOSFET group through the inverter circuit, and
another p-channel MOSFET and complementary MOSFET group, distinct from the at least one p-channel and complimentary MOSFET group, is a low side p-channel MOSFET and complementary MOSFET group configured to receive the low side modulated signal and modulate an application of low current to the load, where the low side modulation signal bypasses the level shifter.

2. The drive circuit of claim 1, further comprising a floating power supply configured to provide a constant voltage from a power supply rail to a floating reference point, and provide a voltage to turn the at least one p-channel MOSFET and complementary MOSFET group on and off based on the level-shifted driver signal.

3. The drive circuit of claim 2, wherein the inverter circuit is tied to a voltage of the power supply rail and provides undervoltage and overvoltage protection between the level shifter and the at least one p-channel MOSFET and complementary MOSFET group.

4. The drive circuit of claim 1, wherein the level-shifted driver signal is a scaled and shifted-up modulated output signal to a predetermined high voltage.

5. The drive circuit of claim 4, wherein the predetermined high voltage is about 20 volts to about 1000 volts.

6. The drive circuit of claim 1, further comprising a floating power supply, wherein the at least one p-channel MOSFET and complementary MOSFET group comprises a plurality of p-channel MOSFETS, each of the plurality of p-channel MOSFETS having a respective complementary MOSFET and the floating power supply is common to and drives each of the plurality of p-channel MOSFETS and the respective complementary MOSFET.

7. The drive circuit of claim 1, wherein the source of modulation is one of a pulse width modulator or a microprocessor control unit.

8. The drive circuit of claim 1, wherein the source of modulation produces a square-wave output.

9. The drive circuit of claim 1, wherein at least the inverter circuit and the at least one P-channel MOSFET and complementary MOSFET group are formed as an integrated circuit.

10. The drive circuit of claim 1 wherein at least one of the high side p-channel MOSFET and complementary MOSFET group and the low side p-channel MOSFET and complementary MOSFET group form a complimentary output driver having a common undervoltage detector.

11. A drive circuit comprising:
at least one source of modulation for producing a high side modulated signal and a low side modulation signal;
at least one switching circuit including
a level shifter configured to receive the high side modulated signal and produce a level-shifted driver signal;
at least one p-channel metal oxide semiconductor field effect transistor (MOSFET);
an inverter circuit configured to receive the level-shifted driver signal and produce a MOSFET control signal;
at least one complementary MOSFET having a different predetermined electrical characteristic than the at least one p-channel MOSFET, each complementary MOSFET being coupled with a respective one of the at least one p-channel MOSFET to form a respective p-channel MOSFET and complementary MOSFET group;
wherein,
at least one p-channel MOSFET and complementary MOSFET group is a high side p-channel MOSFET and complementary MOSFET group configured to receive the MOSFET control signal and modulate an application of high current to a load, where the MOSFET control signal is supplied directly to each of the high side p-channel MOSFET and complementary MOSFET group through the inverter circuit, and another p-channel MOSFET and complementary MOSFET group, distinct from the at least one p-channel and complimentary MOSFET group, is a low side p-channel MOSFET and complementary MOSFET group configured to receive the low side modulated signal and modulate an application of low current to the load, where the low side modulation signal bypasses the level shifter; and a floating power supply common to each of the at least one switching circuit and being configured to supply an activation voltage to each of the high side p-channel MOSFET and complementary MOSFET group of the at least one switching circuit based on the level-shifted drive signal.

12. The drive circuit of claim 11, wherein the floating power supply is configured to provide a constant voltage from a power supply rail to a floating reference point.

13. The drive circuit of claim 12, wherein the inverter circuit is tied to a voltage of the power supply rail and provides undervoltage and overvoltage protection between the level shifter and the at least one p-channel MOSFET and complementary MOSFET group.

14. The drive circuit of claim 11, wherein the level-shifted driver signal is a scaled and shifted-up modulated output signal to a predetermined high voltage.

15. The drive circuit of claim 14, wherein the predetermined high voltage is about 20 volts to about 1000 volts.

16. The drive circuit of claim 11, wherein the source of modulation is one of a pulse width modulator or a microprocessor control unit.

17. The drive circuit of claim 11, wherein the source of modulation produces a square-wave output.

18. A method of driving at least one p-channel metal oxide semiconductor field effect transistor (MOSFET) comprising:

receiving one or more of a high side modulation signal and a low side modulation signal from at least one modulated source;

where a high side modulation signal is received level shifting the high side modulation signal with a level shifting circuit to produce a level-shifted driver signal having a voltage greater than a maximum gate voltage of the at least one p-channel MOSFET;

inverting the level-shifted driver signal with an inverter circuit to produce an inverted drive output signal; and applying the inverted drive output signal to a voltage divider circuit to provide a scaled drive signal to the gate of the at least one p-channel MOSFET and at least one complementary MOSFET having a different predetermined electrical characteristic than the at least one p-channel MOSFET, each complementary MOSFET being coupled with a respective one of the at least one p-channel MOSFET forming at least a respective high side p-channel MOSFET and complementary MOSFET group, where at least one p-channel MOSFET and complementary MOSFET group is coupled to the inverter circuit through the voltage divider circuit and provides a modulated high current from a supply to a load; and where a low side modulation signal is received, modulating an application of low current to the load with another p-channel MOSFET and complementary MOSFET group, forming a low side p-channel and complimentary MOSFET group that is distinct from the high side p-channel and complimentary MOSFET group.

19. The method of claim 18, wherein the level-shifted driver signal is a scaled and shifted-up modulated output signal to a predetermined high voltage of about 20 volts to about 1000 volts.

20. The method of claim 18, further comprising driving the at least one p-channel MOSFET with a floating power supply common to each of the high side p-channel MOSFET and complementary MOSFET group.

21. The method of claim 18, further comprising providing undervoltage and overvoltage protection between the level shifting circuit and the high side p-channel MOSFET and complementary MOSFET group where the inverter circuit is tied to a voltage of a supply rail.

* * * * *